US012618895B2

(12) United States Patent
Schat et al.

(10) Patent No.: US 12,618,895 B2
(45) Date of Patent: May 5, 2026

(54) TEST SYSTEM FOR DETECTING FAULTS IN MULTIPLE DEVICES OF THE SAME TYPE

(71) Applicant: NXP B.V., Eindhoven (NL)

(72) Inventors: Jan-Peter Schat, Hamburg (DE); Paul Wielage, Waalre (NL)

(73) Assignee: NXP B.V., Eindhoven (NL)

( * ) Notice: Subject to any disclaimer, the term of this patent is extended or adjusted under 35 U.S.C. 154(b) by 596 days.

(21) Appl. No.: 18/149,536

(22) Filed: Jan. 3, 2023

(65) Prior Publication Data

US 2024/0219453 A1    Jul. 4, 2024

(51) Int. Cl.
G01R 31/28        (2006.01)

(52) U.S. Cl.
CPC ..... G01R 31/2837 (2013.01); G01R 31/2841 (2013.01); G01R 31/2843 (2013.01)

(58) Field of Classification Search
CPC ............ G01R 31/2837; G01R 31/2841; G01R 31/2843; G01R 31/316; G01R 31/3167;
(Continued)

(56) References Cited

U.S. PATENT DOCUMENTS

| | | | |
|---|---|---|---|
| 3,636,443 A | | 1/1972 | Singh et al. |
| 4,340,857 A | * | 7/1982 | Fasang ........... G01R 31/318385 |
| | | | 714/E11.169 |

(Continued)

FOREIGN PATENT DOCUMENTS

JP        2020-165802 A      10/2020

OTHER PUBLICATIONS

Learning of Multi-Dimensional Analog Circuits Through Generative Adversarial Network (GAN). 2019 32nd IEEE International System-on-Chip Conference (SOCC), 2019, pp. 394-399.
(Continued)

*Primary Examiner* — Shelby A Turner
*Assistant Examiner* — Yartiza H Perez Bermudez

(57)        ABSTRACT

Various embodiments relate to a method of testing a plurality of devices of the same type wherein each of the plurality of devices of the same type include a built-in self-test device, including: randomly generating, by a processor, stimulus parameters; applying, by the built-in self-test devices, the generated stimulus parameters N times to the plurality of devices of the same type; measuring, by the plurality of devices of the same type, a response of the plurality of devices of the same type to the generated stimulus parameters to produce M×N response outputs, where M is a number of the plurality of devices of the same type; calculating, by the processor, a defect likelihood for a test set of the plurality of identical devices based upon a mean of a reference set of the plurality of identical devices response outputs, a mean of the test set response outputs, a standard deviation of reference set response outputs, and a standard deviation of the test set response outputs; determining, by the processor, that the defect likelihood for the test set is greater than a first threshold value; applying, by the processor, an initial step of a directed random search algorithm to update stimulus parameters in response to determining that the defect likelihood is greater than the first threshold; applying, by the built-in self-test devices, the updated stimulus parameters N times to the plurality of devices of the same type; measuring, by the plurality of devices of the same type, a response of the plurality of devices of the same type to the updated stimulus parameters to produce M×N updated response outputs; calculating, by the processor, a defect likelihood for the test set based upon a mean of the reference set updated response outputs, a mean of the test set updated response outputs, a standard deviation of reference set updated response outputs, and a standard deviation of the test set updated response outputs; and determining, by the processor, that the defect likelihood for (Continued)

the test set is greater than a second threshold, wherein the second threshold is greater than the first threshold.

18 Claims, 10 Drawing Sheets

(58) Field of Classification Search
CPC .......... G01R 31/31724; G01R 31/3187; G01R 31/287; G01R 31/00005; G01R 31/2836; G01R 31/00
See application file for complete search history.

(56) References Cited

U.S. PATENT DOCUMENTS

| | | | | |
|---|---|---|---|---|
| 7,795,894 | B1* | 9/2010 | Sogani | G01R 31/3187 |
| | | | | 714/733 |
| 10,054,634 | B2* | 8/2018 | Chi | G01R 31/31724 |
| 10,841,333 | B2 | 11/2020 | Levy | |
| 2005/0251370 | A1* | 11/2005 | Li | G01R 31/31707 |
| | | | | 702/190 |
| 2006/0242498 | A1 | 10/2006 | Hamilton et al. | |
| 2008/0072111 | A1* | 3/2008 | Le | G01R 31/318502 |
| | | | | 714/E11.169 |
| 2018/0364302 | A1* | 12/2018 | Chieu | G01R 31/2894 |
| 2019/0377027 | A1* | 12/2019 | Rivoir | G01R 31/31708 |
| 2020/0057106 | A1* | 2/2020 | Balasubramanian | |
| | | | | G01R 31/3167 |
| 2021/0156910 | A1* | 5/2021 | Kusko | G01R 31/3187 |
| 2021/0156911 | A1* | 5/2021 | Motika | G01R 31/318385 |
| 2023/0114555 | A1* | 4/2023 | Nagle | G01R 31/287 |
| | | | | 714/724 |

OTHER PUBLICATIONS

Malware detection using machine learning, US 10.841.333B2.
Ian Goodfellow, Jean Pouget-Abadie, Mehdi Mirza, Bing Xu, David Warde-Farley, Sherjil Ozair, Aaron Courville, Yoshua Bengio: Generative Adversarial Nets.
https://towardsdatascience.com/image-generation-in-10-minutes-with-generative-adversarial-networks-c2afc56bfa3b.
https://realpython.com/generative-adversarial-networks/.
Neldar-Mead method. (1965). Retrieved from https://en.wikipedia.org/wiki/Nelder%E2%80%93Mead_method.
R. B. Dean and W. J. Dixon (1951). Simplified Statistics for Small Numbers of Observations. Analytical Chemistry, 23 (4), pp. 636-638.
David B. Rorabacher, Statistical Treatment for Rejection of Deviant Values: Critical Values of Dixon's "Q" Parameter and Related Subrange Ratios at the 95% Confidence Level, Analytical Chemistry, vol. 63, No. 2, Jan. 15, 1991.
Candido, Renato et al; "Generative Adversarial Networks: Build Your First Models"; retreived from the Internet https://realpython.com/generative-adversarial-networks/ ; 23 pages (Nov. 2022).
Dean, R.B. et al; "Simplified Statistics for Small Numbers of Observations"; Analytical Chemistry, 23(4) pp. 636-638 (Apr. 1951).
Dutta, Rahul et al; "Learning of Multi-Dimensional-Analog Circuits Through Generative Adversarial Network (GAN)"; IEEE Int'l System-on Chip Conference; pp. 394-399 (Sep. 2019).
Rorabacher, David B. et al.; "Statistical Treatment for Rejection of Deviant Values: Cricitcal Values of Dixon's "Q" Parameter and Related Subrange Ratios at the 95% Confidence Level"; Analytical Chemistry, vol. 63, No. 2; pp. 139-146 (Jan. 15, 1991).
Wikipedia; Neldar-Meatd Method retreived from https://en.wikipedia.org/wiki/Nelder%E2%80%93Mead_method on Oct. 6, 2022; 6 pages.
Yalcin, Orhan G.; "Image Generationin 10 Minutes with Generative Adversarial Networks"retreived from the Internethttps://towardsdatascience.com/image-generation-in-10-minutes-with-generative-adversarial-networks-c2afc56bfa3b on Oct. 6, 2022; 31 pages (Sep. 17, 2020).
Godfellow, Ian et al; "Generative Adversarial Nets"; University of Montreal, Dept of Information and Research Operation; 9 pages (Jun. 10, 2014).

* cited by examiner

TEST SYSTEM FOR DETECTING FAULTS IN MULTIPLE DEVICES OF THE SAME TYPE

TECHNICAL FIELD

Various exemplary embodiments disclosed herein relate generally to a test system for detecting faults in multiple devices of the same type.

BACKGROUND

In various systems with safety requirements, e.g., self-driving cars, aircraft, building mechanical systems, etc., functional safety requires fail-operational behavior, i.e., providing a reduced, safe function once a defect is detected. This also requires anticipating slowly worsening defects. Many defects in analog mixed-signal (AMS) devices do not occur abruptly, but are slowly worsening, e.g., due to electromigration, wear, or other failure mechanism. Such gradually worsening defects in AMS devices first lead to a slight deviation of parametric values.

Testing AMS devices for parametric deviations is often done by on-chip Built-In Self-Test (BIST). Such BIST engines can often apply different signal frequencies, amplitudes etc. to the AMS device under test. These form part of the feature space. BIST engines also allow measuring different response values—gain, DC voltages etc., as a function of the signal frequency; also these options form a part of this feature space. Further, measurements of the devices may be carried out by components of the device that are used as part of the normal function of the device.

SUMMARY

A summary of various exemplary embodiments is presented below. Some simplifications and omissions may be made in the following summary, which is intended to highlight and introduce some aspects of the various exemplary embodiments, but not to limit the scope of the invention. Detailed descriptions of an exemplary embodiment adequate to allow those of ordinary skill in the art to make and use the inventive concepts will follow in later sections.

Various embodiments relate to a method of testing a plurality of devices of the same type wherein each of the plurality of devices of the same type include a built-in self-test device, including: randomly generating, by a processor, stimulus parameters; applying, by the built-in self-test devices, the generated stimulus parameters N times to the plurality of devices of the same type; measuring, by the plurality of devices of the same type, a response of the plurality of devices of the same type to the generated stimulus parameters to produce M×N response outputs, where M is a number of the plurality of devices of the same type; calculating, by the processor, a defect likelihood for a test set of the plurality of identical devices based upon a mean of a reference set of the plurality of identical devices response outputs, a mean of the test set response outputs, a standard deviation of reference set response outputs, and a standard deviation of the test set response outputs; determining, by the processor, that the defect likelihood for the test set is greater than a first threshold value; applying, by the processor, an initial step of a directed random search algorithm to update stimulus parameters in response to determining that the defect likelihood is greater than the first threshold; applying, by the built-in self-test devices, the updated stimulus parameters N times to the plurality of devices of the same type; measuring, by the plurality of devices of the same type, a response of the plurality of devices of the same type to the updated stimulus parameters to produce M×N updated response outputs; calculating, by the processor, a defect likelihood for the test set based upon a mean of the reference set updated response outputs, a mean of the test set updated response outputs, a standard deviation of reference set updated response outputs, and a standard deviation of the test set updated response outputs; and determining, by the processor, that the defect likelihood for the test set is greater than a second threshold, wherein the second threshold is greater than the first threshold.

Various embodiments are described, further including indicating a defect in response to determining that the defect likelihood is greater than the second threshold.

Various embodiments are described, further including: in response to determining that the defect likelihood is greater than the second threshold repeating: applying the updated stimulus parameters N times to the plurality of devices of the same type; measuring the response of the plurality of devices of the same type to the updated stimulus parameters to produce M×N second response outputs; and calculating a defect likelihood for the test set based upon a mean of the reference set updated response outputs, a mean of the test set updated response outputs, a standard deviation of reference set updated response outputs, and a standard deviation of the test set updated response outputs; determining that the defect likelihood for the test set is greater than the second threshold value; and indicating a defect in response to determining that the repeated defect likelihood is greater than the second threshold.

Various embodiments are described, wherein the directed random search algorithm is a Nelder-Mead search algorithm.

Various embodiments are described, wherein calculating a defect likelihood for the test set further includes: calculating a first moment statistical test $r_{mean}$ as $$r_{mean} = \frac{\text{mean(test\_set)} - \text{mean(ref\_set)}}{std(\text{ref\_set})},$$

where std is a sample standard deviation; and calculating a second moment statistical test $r_{var}$ as $$r_{var} = \frac{std(\text{test}_{set})}{std(\text{ref}_{set})}$$

wherein the estimated defect likelihood s is determined from the mean value of a standard normal distribution as: s=max (abs(r2s_m($r_{mean}$)), abs(r2s_v($r_{var}$))), where r2s_m( ) and r2s_v( ) are functions that map the values $r_{mean}$ and $r_{var}$ to the values $s_{mean}$ and $s_{var}$ with cdf_m($r_{mean}$)=normcdf($s_{mean}$), cdf_v($r_{var}$)=normcdf($s_{var}$), and cdf_m( ) and cdf_v( ) are the cumulative distribution functions of ratios $r_{mean}$ and $r_{var}$ respectively, and normcdf(s) is the cumulative distribution function of the standard normal distribution.

Various embodiments are described, further including: in response to determining that the updated estimated defect likelihood is less than the first threshold repeating: randomly generating stimulus parameters; applying the generated stimulus parameters N times to the plurality of devices of the same type; and measuring the response of the plurality of devices of the same type to the generated stimulus parameters to produce M×N response outputs; and in response to determining that the updated estimated defect is greater than the first threshold: applying an iteration step of the directed random search algorithm to update stimulus parameters in response to determining that the defect likelihood is less than the first threshold.

Further various embodiments relate to a test system for testing a plurality of devices of the same type, including: a plurality of built-in self-test (BIST) devices, wherein each of the plurality of devices of the same type include one of the plurality of BIST devices; at least one processor; and at least one memory storing instructions, that in response to determining that executed by the at least one processor, cause the test system at least to: randomly generate stimulus parameters; apply, by the built-in self-test devices, the generated stimulus parameters N times to the plurality of devices of the same type using the BIST devices; measure, by the plurality of devices of the same type, a response of the plurality of devices of the same type to the generated stimulus parameters to produce M×N response outputs, where M is a number of the plurality of devices of the same type; calculating a defect likelihood for a test set of the plurality of identical devices based upon a mean of a reference set of the plurality of identical devices response outputs, a mean of the test set response outputs, a standard deviation of reference set response outputs, and a standard deviation of the test set response outputs; determine that the defect likelihood for the test set is greater than a first threshold value; apply an initial step of a directed random search algorithm to update stimulus parameters in response to determining that the defect likelihood is greater than the first threshold; apply, by the built-in self-test devices, the updated stimulus parameters N times to the plurality of devices of the same type; measure, by the plurality of devices of the same type, a response of the plurality of devices of the same type to the updated stimulus parameters to produce M×N updated response outputs; calculating a defect likelihood for the test set based upon a mean of the reference set updated response outputs, a mean of the test set updated response outputs, a standard deviation of reference set updated response outputs, and a standard deviation of the test set updated response outputs; and determining that the defect likelihood for the test set is greater than a second threshold, wherein the second threshold is greater than the first threshold.

Various embodiments are described, wherein the at least one memory storing instructions cause the test system at least to indicate a defect in response to determining that the defect likelihood is greater than the second threshold.

Various embodiments are described, wherein the at least one memory storing instructions cause the test system at least to: in response to determining that the defect likelihood is greater than the second threshold repeating: apply the updated stimulus parameters N times to the plurality of devices of the same type; measure the response of the plurality of devices of the same type to the updated stimulus parameters to produce M×N second response outputs; and calculate a defect likelihood for the test set based upon a mean of the reference set updated response outputs, a mean of the test set updated response outputs, a standard deviation of reference set updated response outputs, and a standard deviation of the test set updated response outputs; compare the defect likelihood for the test set to the second threshold value; and indicate a defect in response to determining that the repeated defect likelihood is greater than the second threshold.

Various embodiments are described, wherein the directed random search algorithm is a Nelder-Mead search algorithm.

Various embodiments are described, wherein calculating a defect likelihood for the test set further includes: calculating a first moment statistical test $r_{mean}$ as $$r_{mean} = \frac{mean(test\_set) - mean(ref\_set)}{std(ref\_set)},$$

where std is a sample standard deviation; and calculating a second moment statistical test $r_{var}$ as $$r_{var} = \frac{std(test_{set})}{std(ref_{set})}$$

wherein the estimated defect likelihood s is determined from the mean value of a standard normal distribution as: s=max (abs(r2s_m($r_{mean}$)), abs(r2s_v($r_{var}$))), where r2s_m( ) and r2s_v( ) are functions that map the values $r_{mean}$ and $r_{var}$ to the values $s_{mean}$ and $s_{var}$ with cdf_m($r_{mean}$)=normcdf($s_{mean}$), cdf_v($r_{var}$)=normcdf($s_{var}$), and cdf_m( ) and cdf_v( ) are the cumulative distribution functions of ratios $r_{mean}$ and $r_{var}$ respectively, and normcdf(s) is the cumulative distribution function of the standard normal distribution.

Various embodiments are described, wherein the at least one memory storing instructions cause the test system at least to: in response to determining that the updated estimated defect likelihood is less than the first threshold repeat: randomly generate stimulus parameters; apply the generated stimulus parameters N times to the plurality of devices of the same type; and measure the response of the plurality of devices of the same type to the generated stimulus parameters to produce M×N response outputs; and in response to determining that the updated estimated defect is greater than the first threshold: apply an iterations step of the directed random search algorithm to update stimulus parameters in response to determining that the defect likelihood is less than the first threshold.

Further various embodiments relate to a method of testing a plurality of devices of the same type wherein each of the plurality of devices of the same type include a built-in self-test device, including: generating, by a discriminator, stimulus parameters, wherein the discriminator is a machine learning model; applying, by the built-in self-test devices, the generated stimulus parameters to the plurality of devices of the same type; measuring a response of the plurality of devices of the same type to the generated stimulus parameters to produce M response outputs, where M is a number of the plurality of devices of the same type; generating, by a generator, M−1 weights, wherein the generator is a machine learning model; calculating a first response output from a first identical device of the plurality of devices of the same type as a weighted average of the other M−1 response outputs using the M−1 weights associated with M−1 other devices of the same type; determining a difference between the estimated first response output the first response output; updating the discriminator and the generator using the first response output in response to determining that the difference is less than a threshold; updating the discriminator and the generator using the estimated first response output in response to determining that the difference is greater than the threshold; and controlling, by a controller the discriminator and the generator to act as a generative adversarial network wherein discriminator searches for stimulus parameters that indicate defects and wherein the generator to generate M−1 weights that indicate defects.

Various embodiments are described, further including indicating a defect in the first identical device associated with the first response output in response to determining that the difference is greater than the threshold.

Various embodiments are described, further including outputting, by the discriminator, device control parameters to the plurality of devices of the same type.

Further various embodiments relate to a test system for testing a plurality of devices of the same type wherein each of the plurality of devices of the same type include a built-in self-test device, including: a plurality of built-in self-test (BIST) devices, wherein each of the plurality of devices of the same type include one of the plurality of BIST devices; and at least one processor; and at least one memory storing instructions, that in response to determining that executed by the at least one processor, cause the test system at least to: generate stimulus parameters by a discriminator implemented as a machine learning model in the at least one processor; apply the generated stimulus parameters to the plurality of BIST devices; receive M response outputs from the plurality of BIST devices, where M is a number of the plurality of devices of the same type; generate M−1 weights by a generator implemented as a machine learning model in the at least one processor; estimate a first response output from a first identical device of the plurality of devices of the same type as a weighted average of the other M−1 response outputs using the M−1 weights associated with M−1 other devices of the same type; determine a difference between the estimated first response output the first response output; update the discriminator and the generator using the first response output in response to determining that the difference is less than a threshold; update the discriminator and the generator using the estimated first response output in response to determining that the difference is greater than the threshold; and control the discriminator and the generator act as a generative adversarial network wherein discriminator searches for stimulus parameters that indicate defects and wherein the generator to generate M−1 weights that indicate defects.

Various embodiments are described, wherein the at least one memory storing instructions cause the test system at least to indicate a defect in the first identical device associated with the first response output in response to determining that the difference is greater than the threshold.

Various embodiments are described, wherein the at least one memory storing instructions cause the test system at least to output device control parameters generated by the discriminator to the plurality of devices of the same type.

BRIEF DESCRIPTION OF THE DRAWINGS

In order to better understand various exemplary embodiments, reference is made to the accompanying drawings, wherein.

To facilitate understanding, identical reference numerals have been used to designate elements having substantially the same or similar structure and/or substantially the same or similar function.

DETAILED DESCRIPTION

Figure 1:
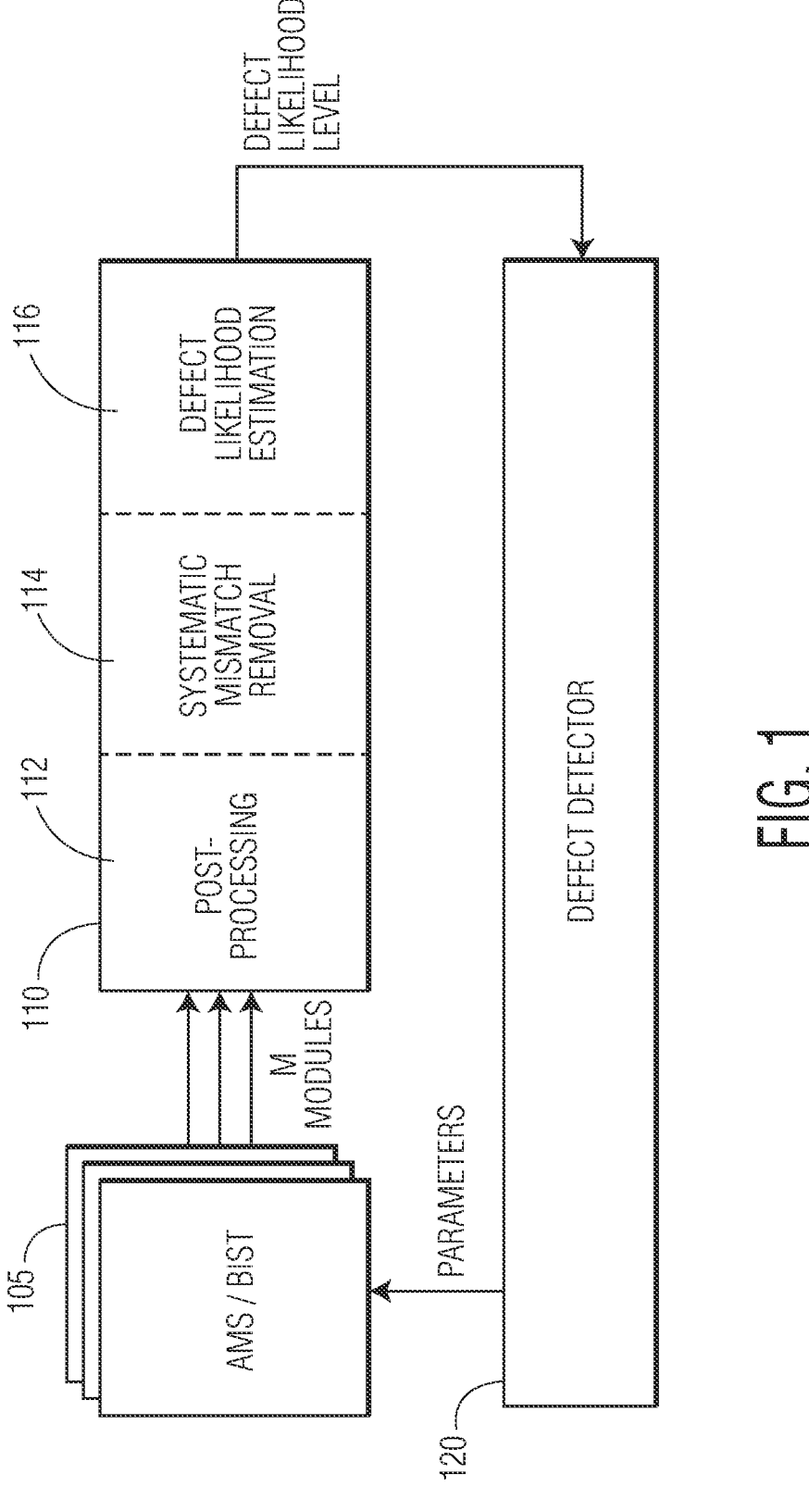
FIG. 1 illustrates a first embodiment of a test system.

The description and drawings illustrate the principles of the invention. It will thus be appreciated that those skilled in the art will be able to devise various arrangements that, although not explicitly described or shown herein, embody the principles of the invention and are included within its scope. Furthermore, all examples recited herein are principally intended expressly to be for pedagogical purposes to aid the reader in understanding the principles of the invention and the concepts contributed by the inventor(s) to furthering the art and are to be construed as being without limitation to such specifically recited examples and conditions. Additionally, the term, "or," as used herein, refers to a non-exclusive or (i.e., and/or), unless otherwise indicated (e.g., "or else" or "or in the alternative"). Also, the various embodiments described herein are not necessarily mutually exclusive, as some embodiments can be combined with one or more other embodiments to form new embodiments.

In various systems with safety requirements, e.g., self-driving cars, aircraft, building mechanical systems, etc., functional safety requires fail-operational behavior, i.e., providing a reduced, safe function once a defect is detected. This also requires anticipating slowly worsening defects. Many defects in analog mixed-signal (AMS) devices do not occur abruptly, but are slowly worsening, e.g., due to electromigration, wear, or other failure mechanism. Such gradually worsening defects in AMS devices first lead to a slight deviation of parametric values. While AMS devices are used as an example in the description below, other types of devices may also have similar sorts of failure mechanisms and issues, and as a result the disclosed test system embodiments may also apply to these sorts of systems.

Usually, such parametric deviations can best be tested under conditions that are specific for the respective defect—e.g., some defects can best be tested at low voltage and others at high voltage or some defects can best be tested at low frequency and others at high frequency. These conditions can be set by AMS control settings, and the control settings form one part of the feature space for the AMS test, i.e. of the options that can be chosen for the test. Also parameters of the AMS device may be tested over a range of values.

Testing AMS devices for parametric deviations is often done by on-chip built-in self-test (BIST). Such BIST engines can often apply different parameters, e.g., signal frequencies, amplitudes, etc. to the AMS device under test. These form part of the feature space. BIST engines also allow measuring different response values—gain, DC voltages, etc.—as function of the signal frequency, signal level, etc.; also these options form a part of this feature space. Hence, this feature space for the parametric tests has a large number of dimensions, and thus a very large number of possible combinations.

In the descriptions of the test system embodiments below, an example of a self-driving car will be used to illustrate the operation and application of the test system embodiments. The test system embodiments may be applied to AMS devices of which multiple identical instances are used. The test system includes: a way to control and/or observe the analog signal—as it is often the case e.g. in a BIST environment; a way to control several digital control parameters like bias current settings, bandwidths settings, etc. (also this is the case in most AMS devices); a processor either in the same SoC, or at least within reach of the AMS device; and a need to observe the AMS devices for parametric variations in real time, in order to take preemptive measures in case of imminent failure.

Some examples, AMS devices could include: RF interface ICs, e.g., WLAN/mobile phone interfaces which use MIMO, and hence multiple identical receive and/or transmit modules; sensor integrated circuits (ICs) using multiple AMS devices, e.g., in an automotive context; and sensor arrays, either in a triple redundancy environment, or for measuring environment parameters at different locations, e.g., smoke detector or CO2 detector.

Moreover, the defects to be detected are very diverse in nature. The interdependencies of most of these options are very hard to put into a physical/mathematical model. This is because most of them are non-linear and dependent on factors like temperature and aging. The whole environment of defect detection is hence extremely complex. Moreover, even small ICs or small AMS modules have a very large number of possible defects. As a result, today's BIST techniques are not sufficiently able to handle this situation to satisfy the requirements of detecting early defects for functional safety. As mentioned, the problem is to find a point in the feature space for testing for a parametric deviation, with a low rate of false-positive and low false-negative results. Unfortunately, the feature space is usually hard to model, because it is non-linear and has a high number of dimensions and a large number of potential defects.

In an automotive driver assistance system (ADAS), the functional safety system needs to ensure fail-safe behavior, i.e., to stop the respective assistance function once a defect is detected. A defective radar system will hence alert the driver that if it is not available anymore; the driver can then continue driving without it. For this fail-safe behavior, it is sufficient to detect a defect as soon as it impacts the function.

In self-driving cars, however, requirements are stricter: functional safety needs to ensure fail-operational behavior, i.e., to provide a reduced, safe function once a defect is detected. This also requires anticipating slowly worsening defects. Many defects in AMS devices do not occur abruptly, but are slowly worsening—due to electromigration, gradually weaking of vias, breaks in metal wires, break-thru of oxides etc. Such gradually worsening defects in AMS devices first lead to as slight deviation of parametric values.

Usually, such parametric defects manifest themselves most clearly at certain conditions—some examples include: leakage paths in dielectric at high supply voltage; resistive shorts at low supply voltage; wire breaks or weak vias at low signal frequency; resistive opens at high signal frequency; increased cross talk due to particles at high signal amplitudes; and increased noise level at low signal amplitudes. Aging of AMS devices also can lead to defects.

Testing AMS devices for parametric deviations is often done by on-chip Built-In Self-Test (BIST). Such BIST engines can often apply different signal frequencies, amplitudes, etc. to the AMS device under test. They also allow measuring different response values—gain, DC voltages etc., as a function of the signal frequency.

There is a huge feature space, i.e., a space of different AMS control parameters, associated measured values to consider, and BIST settings. Today's AMS devices under test have a lot of AMS control parameters, such as for example, settings of bias currents, reference voltages, filter settings, gain settings, etc. Also, today's BIST modules allow the application of BIST stimulus parameters with a large number of different signal amplitudes, frequencies, and shapes. Further, today's BIST modules allow for the analysis of the AMS device output signal, and the BIST modules measure a large number of values of the AMS device, like frequency response, transient response, crosstalk, etc. The measured values of the AMS device may be compared either to fixed limits, or to the same value of other, identical modules. This is often possible where multiple identical AMS devices are present, e.g., in car radar ICs that may have 3-4 identical transmitter modules and 3-4 identical receiver modules.

There is hence a wide variety of different features that the BIST module may address (i.e., AMS control parameters, BIST stimulus parameters, BIST response parameters, and limits). Moreover, the defects to be detected are very diverse in nature. The interdependencies of most of these factors are very hard to put into a physical/mathematical model. This is also because most of them are non-linear and dependent on factors like temperature and aging. The whole environment of defect detection is hence extremely complex.

Today's BIST techniques are not sufficiently able to handle this situation to satisfy the requirements of detecting early defects for functional safety. There is hence no technique to reliably detect such marginal failures by perusing the mentioned feature space efficiently and to select the right feature combination suitable for defect detection. The problem is to find a point for testing a parametric defect with low false-positive and low false-negative results in a feature space which is hard to model. Further, the transfer function of the AMS device in the feature space is often non-linear (e.g., the gain at a certain frequency as function of a bias current is usually non-linear); and the number of potential defects is very high. Also, the feature space has a high number of dimensions. The requirement for the parametric test is to find a good solution with restricted effort instead of the best solution with high effort. Finally, to find this good solution, there is no means for supervised learning; in other words, there is a requirement for unsupervised learning.

The test system embodiments described herein relates to ICs with several identical AMS devices. The situation that needs to be detected is that in many points of the feature space, one of these modules behaves slightly different to the others—but in most of these points, it is not clear if this different behavior is simply a normal deviation due to manufacturing tolerances, or if it is due to a defect. In a smaller range of the feature space, however, this deviation is so large that it can be classified as a defect, i.e. as a deviation from normal function that may still allow normal function, but soon requires replacement of the AMS device to prevent the defect from further worsening that then may render the entire IC defective.

The fault to be detected will lead to a non-linear behavior in the feature space. This means, that the module's result substantially differs from the result of the other modules. In other words, the task is to detect if one module behaves such that it notably differs from the others. The selection of stimuli, and the decision if a module is considered marginally defective (or shall better be tested using another set of stimuli, to be better able to detect if it is defective or not) is hence key.

Each AMS device will have BIST hardware included. The BIST hardware may include stimulus generator that generates inputs to the AMS device to stimulate a response from the AMS device that may be tested to detect defects. Further, the BIST may include additional hardware or software that processes the output response to use in detecting defects. For example, a fast Fourier transform (FFT) may be performed on the output response. The BIST hardware may include a controller that helps to control the BIST. Such controller may control stimulus generator and the processing of the output response. The controller may also receive inputs from external sources to provide additional control of the BIST hardware.

The BIST runs are preferably performed during breaks in the operation of the AMS device. For example, in auto radar systems, especially in frequency modulated continuous wave (FMCM) systems, this is the case between one chirp and the next. This break may be approximately 5 to 100 ms in length. A complete self-test run of the AMS device often may take more than this time. However, the self-test may be intermittently executed during several breaks. In other systems, there may be regular breaks where the AMS device does not need to operate, or it may at least be possible to schedule breaks during which no harm to the functionality of the AMS device results.

Two test system embodiments will be described. FIG. 1 illustrates a first embodiment of a test system. The test system 100 includes M AMS devices 105 that include BIST hardware. The solution for detecting defects during the lifetime of the product is to run BIST tests on several identical AMS devices 105 and compare the results to find excessive deviations in one of the modules, caused by defects. The stimulated test outputs of the AMS devices 105 are processed by a processor 110. The processor 110 may be a dedicated hardware processor running software. In other embodiments, the processor may include specific hardware configured to carry out specific functions. The test system 100 may first perform post processing 112 on the stimulated test outputs of the AMS devices to obtain characteristic quantities: e.g., FFT analysis, ratio calculation, etc. For example, an FFT, filtering, or any other needed post processing 112 may be applied. Next, the processor 110 may remove systematic mismatch 114 such as the correction of shift and scaling errors due to variation in the physical location of the modules and related load variations. Then the processor 110 performs the defect likelihood estimation 116. The defect likelihood estimation 116 compares and combines the measurements and determines a defect likelihood level. The defect detector 120 receives the output of the defect likelihood estimation 116 and uses the output to detect defects. The defect detector 120 also provides test parameters to the AMS devices 105. The operation of the defect detector 120 will be described below.

The estimation of the defect likelihood level will now be described. The objective of this test system 100 is to identify defects. This is accomplished by capturing signals with on-chip analog-to-digital converters (ADCs) or related means. Defects may be identified for particular signals (or derived quantities) that may be compared to a constant, optionally mode dependent, threshold. If the signal does not comply to the requirement, a defect may be indicated. For signals which cannot be tested against static levels and that exist in a multitude of equivalent modules, these signals may be compared mutually. That is for a number of AMS devices 105 the statistics of the signals are compared.

The measurements of analog signals will always be affected by noise in the signals and the applied measurement method. Hence, measurements will by nature not be exactly the same. To that end, based on statistics, the level of deviation is computed or estimated; above a certain level of deviation (in sigma units) the signal is considered to be affected by a defect.

The defect likelihood estimation is inspired by the outlier rejection method as described in "Simplified Statistics for Small Numbers of Observations," R. B. Dean and W. J. Dixon, Analytical Chemistry, Vol. 23, No. 4, April 1951 and "Statistical Treatment for Reaction of Deviant Values: Critical Values of Dixon's "Q" Parameter and Related Subrange Ratios of the 95% Confidence Level," David B. Rorabacher, Analytical Chemistry, Vol. 63, No. 2, Jan. 15, 1991. They define formulas and criteria for rejecting samples from a (small) set of observations based on statistical treatment given a certain confidence level.

In this context, the samples are divided into two sets. One set includes measurements of modules that are considered to be defect-free. This set is called the reference set. A second set includes the measurements of a module that are tested for having a potential defect. This set is called the test set. The test set is compared against the reference set.

The measurements of the M modules are denoted by $M_1 \ldots M_M$. A defect may affect one or more modules. In Table 1, the test layout of the modules over the test and reference sets is depicted for defects that affect a single module. For M=4 this results in 4 test cases.

TABLE 1

| Test-case # | Test-assumption | Test-set | Reference-set |
|---|---|---|---|
| 1 | Defect affecting one module | M1 | M2 + M3 + M4 |
| 2 | Defect affecting one module | M2 | M1 + M3 + M4 |
| 3 | Defect affecting one module | M3 | M1 + M2 + M4 |
| 4 | Defect affecting one module | M4 | M1 + M2 + M3 |

In Table 2, the test layout is for a case where a defect affects not one, but two modules. For M=4 this results in 6 test-cases.

TABLE 2

| Test-case # | Test-assumption | Test-set | Reference-set |
|---|---|---|---|
| 5 | Defect affecting two modules | M1 + M2 | M3 + M4 |
| 6 | Defect affecting two modules | M1 + M3 | M2 + M4 |
| 7 | Defect affecting two modules | M1 + M4 | M2 + M3 |
| 8 | Defect affecting two modules | M3 + M4 | M1 + M2 |
| 9 | Defect affecting two modules | M2 + M4 | M1 + M3 |
| 10 | Defect affecting two modules | M2 + M3 | M1 + M4 |

For a stimulus parameter set, these test-cases are evaluated which yields a defect likelihood estimation for each case. The over-all defect likelihood estimation is obtained by taking the maximum over all cases. Note that a single set of measurements will allow for the estimation of all cases; each case is just a different allocation of the measurements to the test and reference sets. The maximum of the sigma value is taken, but a high sigma corresponds to a small likelihood of occurrence. A small probability of occurrence means a high probability of a defect. For example, if the system is defined for 50 deviations, a deviation of 66 means an almost certain probability of a defect (in particular in case the deviation is persistent).

The estimation of the defect likelihood is based on comparing the statistics (the first and second moments) of the signals (or derived quantities from the signal) assuming that the measurements of these signals are Gaussian distributed. The statistics are calculated from a number of measurements, denoted by N. In this embodiment it is assumed that N=5. Though testing a simulation, it has been determined that N=5 provides the ability to detect defects. Other values of N may be used as well, but there is a tradeoff between N and how much time the testing takes. So keeping N as low as possible reduces the impact of doing defect testing on the operation of the system. Hence, N may be set to be less than or equal to 5, 10, 15, 20, or 25. The tradeoff for increasing N is greater ability to detect defects, but at the expense of testing time. This increased testing them then means that it will take longer to find a defect.

Generalized ratio expressions for the first (mean) and second (variance) moments will now be described. The following two generalized expressions are proposed to derive the likelihood of a defect being present based on the measurements in the test set and the reference set:

$$r_{mean} = \frac{\text{mean(test\_set)} - \text{mean(ref\_set)}}{std(\text{ref\_set})}; \text{ and}$$

$$r_{var} = \frac{std(\text{test}_{set})}{std(\text{ref}_{set})}.$$

The ratio expression for $r_{mean}$ can yield negative and positive values and has an expected value of 0. Very negative or positive ratio values are unlikely and may indicate a defect or severe parameter shift. In the next section, a mapping function is described that relates any ratio value $r_{mean}$ to the likelihood of occurrence under normal conditions based upon sigma values.

The ratio expression for $r_{var}$ can yield only positive values. Ratio values close to 0 or very large ratio values are unlikely and may indicate the presence of a defect or severe parameter shift.

The mapping function from the r-values to an s-value (sigma value) will now be described. The distributions of the $r_{mean}$ and $r_{var}$ ratio values need to be known for mapping such ratio values to the defect likelihood of occurrence as indicated by sigma values. The probability distributions of the ratio-test values may be estimated or characterized by means of, e.g., Monte-Carlo simulation, production testing or statistical modeling. Given the distributions of the $r_{mean}$ and $r_{var}$ ratio values, the likelihood of occurrence of each ratio-test result is defined by the cumulative distribution function (cdf). Using the cdf, the r-values can be mapped to s-values that represent the corresponding deviation in sigma units for a normal distribution. For this mapping function $$s = \text{func\_r2s}(r)$$

it holds that $$cdf(r) = normcdf(s),$$

where cdf(r) is the estimated cumulative distribution function of the ratio values $r_{mean}$ and $r_{var}$ respectively, and normcdf(s) is the normal cumulative distribution function of the standard normal distribution, evaluated at the values in r and s respectively.

The distributions of $r_{mean}$ and $r_{var}$, and hence the r-to-s mapping functions, depend on the actual signal-under-test (its statistical properties) and the test-case size (the sizes of the test-set and the size of reference set).

To that end, the distributions are estimated by means of e.g., Monte-Carlo simulation, production testing, or statistical modeling. Once the estimated distributions of $r_{mean}$ and $r_{var}$ are obtained, a mathematical function s=func_r2s(r) is fitted such that for the mapped values s holds:

$$cdf(r) = normcdf(s).$$

Table 3 shows the relation between s and normcdf(s) based upon a normal distribution:

TABLE 3

| s | normcdf(s)*100% |
|---|---|
| −4 | 0.003% |
| −3 | 0.14% |
| −2 | 2.3% |
| −1 | 15.9% |
| 0 | 50% |
| 1 | 84.1 |
| 2 | 97.7 |
| 3 | 99.87 |
| 4 | 99.997 |

Figure 2B:
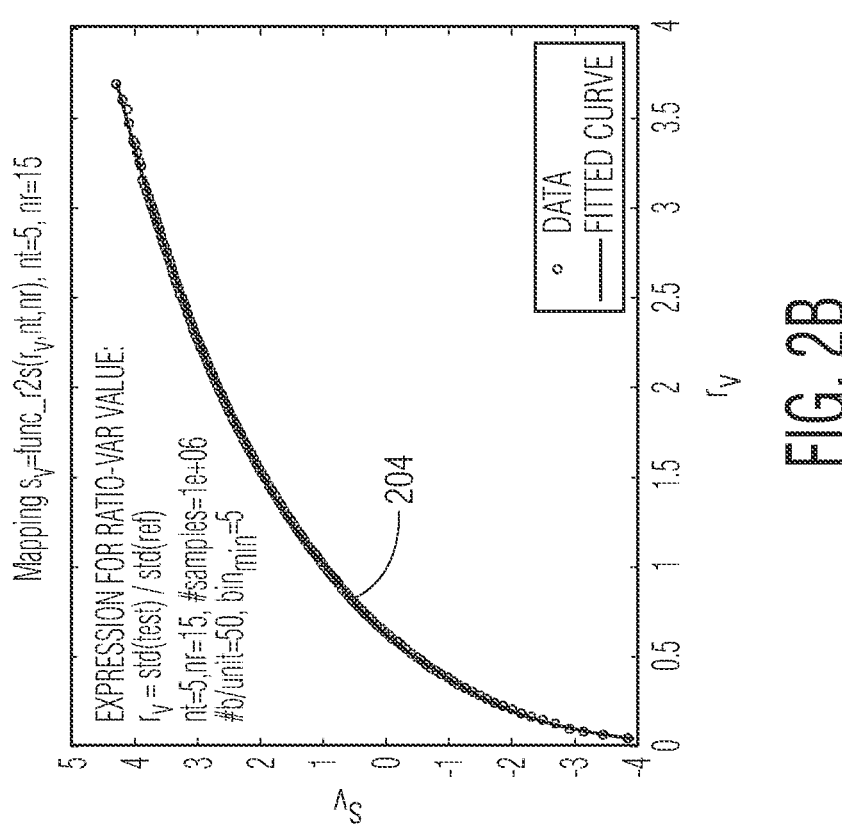
FIGS. 2A and 2B illustrate the mapping functions from $r_{mean}$ and $r_{var}$, respectively, to s for nt=5 and nr=15 assuming a signal with a standard-normal distribution.
Figure 2A:
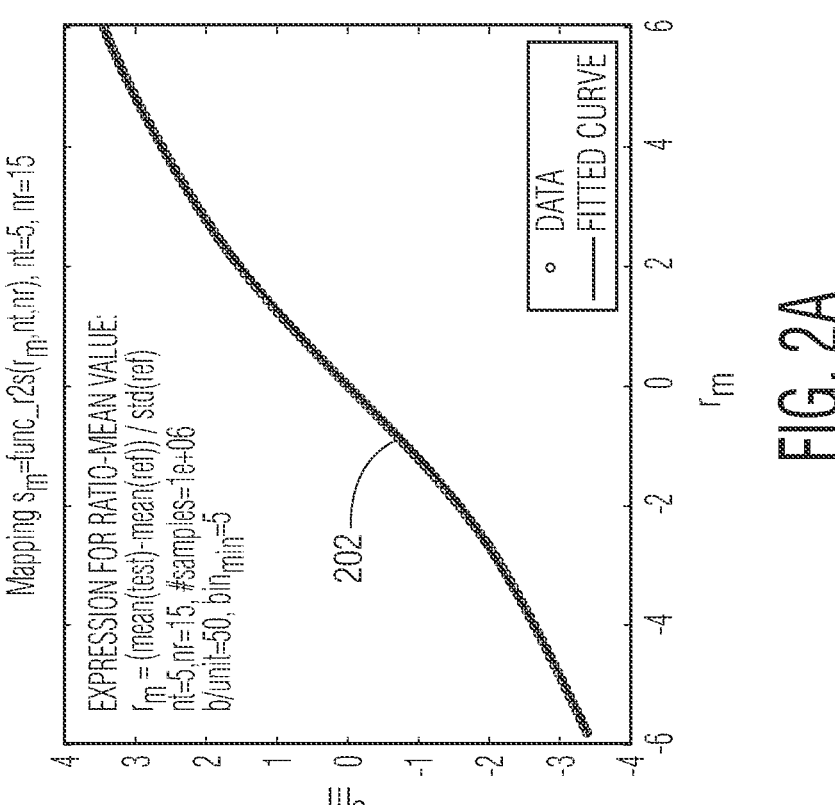

FIGS. 2A and 2B illustrate the mapping functions from $r_{mean}$ and $r_{var}$, respectively, to s for nt=5 and nr=15 assuming a signal with a standard-normal distribution. In FIG. 2A the plot 202 illustrates the mapping between $r_{mean}$ and $s_{mean}$. In FIG. 2B the plot 204 illustrates the mapping between $r_{var}$ and $s_{var}$.

If a device or product is designed for a 5 (or 6) sigma variation, detection of a s-value larger then 5 (or 6) means that the product is operating out-of-spec which might indicate the presence of a defect or severe parameter-shift. To combine the $r_{mean}$ and $r_{var}$ likelihoods, the maximum of the correspondingly absolute values of the s-values shall be taken: S=max(abs($s_{mean}$), abs($s_{var}$)). This may then be compared to a threshold value in an alike test that indicates if there is a defect present.

To show the robustness of the defect likelihood estimation function(s), the defect likelihood for 100,000 experimental cases in 4 scenarios as listed in Table 4 has been evaluated. FIGS. 2C-2F illustrate plots of the probability density function for the alike test for each of the experimental cases listed in Table 3. For each of these cases, 5 values for the test set and 15 values for the reference set were computed; these values were created using a random function that follows a gaussian distribution; mean and standard deviation as input to the random number function were chosen according to the scenario mentioned in the respective line in Table 3. Such a value could, for example, be the gain of an amplifier, or a bias voltage of an ADC, DAC, PLL VCO, or the like.

TABLE 4

| Scenario | Test-set (nt = 5) | | Reference-set (nr = 15) | | Note |
|---|---|---|---|---|---|
| | Mean | Std-dev | mean | Std-dev | |
| 1 | 10.0 | 0.1 | 10.0 | 0.1 | Reference |
| 2 | 11.5 | 0.1 | 10.0 | 0.1 | Deviating Mean |
| 3 | 10.0 | 0.4 | 10.0 | 0.1 | Deviating Std-dev |
| 4 | 11.5 | 0.4 | 10.0 | 0.1 | Deviating Mean & Std-dev |

Figure 2D:
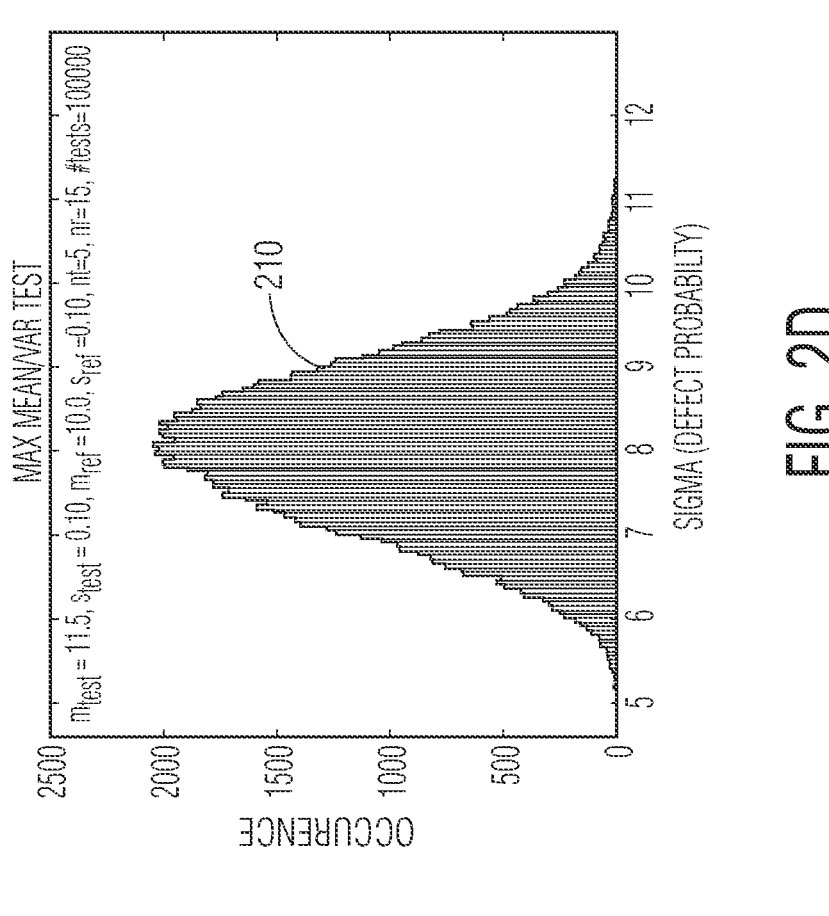
FIGS. 2C-2F illustrate plots of the probability density function for the alike test for each of the experimental cases listed in Table 3.
Figure 2C:
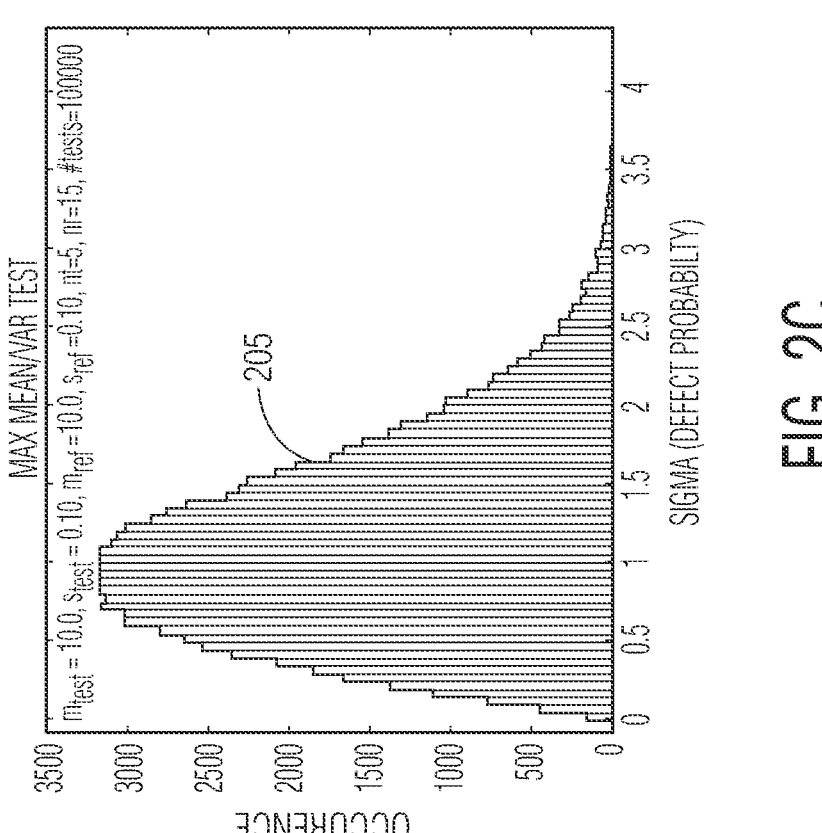

The first scenario is for reference purposes where both the test and reference set have equal statistics. When setting the threshold for sigma to, for example, 4, there are nearly no false alerts, i.e., in nearly no case would the defect-less reference module be flagged as defective. Falsely flagged cases may be caught by re-testing (possibly with a higher number of samples) as described below. FIG. 2C illustrates a plot of the probability density 205 of the alike test for the first scenario.

The second scenario has a test set with a deviating mean that is supposed to be due to a defect. FIG. 2D illustrates a plot of the probability density 210 of the alike test for the second scenario. As can be seen, the probability density 210 has shifted significantly upward and is centered around a little more than 8 sigma.

Figures 2E, 2F:
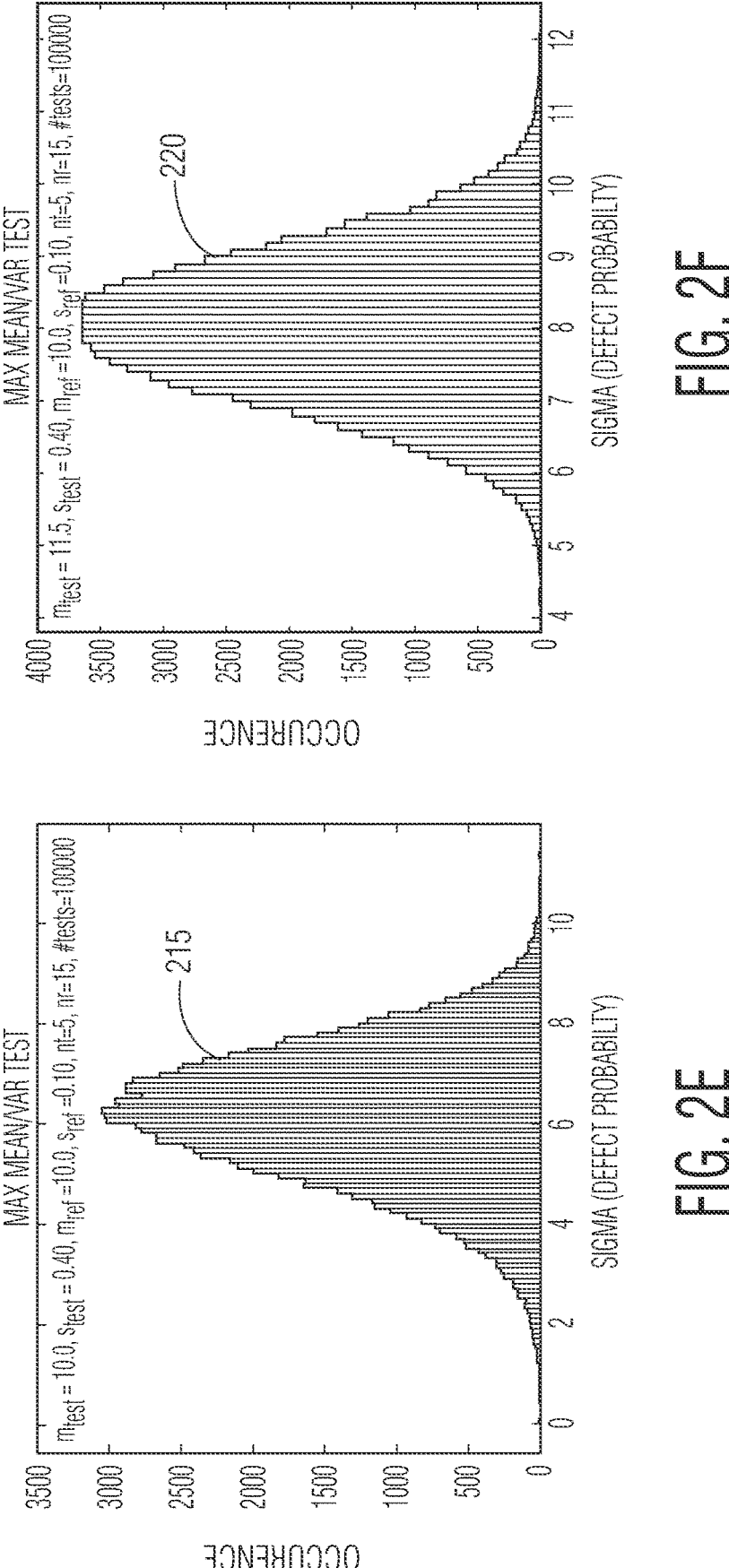

The third scenario has a test set with an increased standard deviation that is supposed to be due to a defect. FIG. 2E illustrates a plot of the probability density 215 of the alike test for the third scenario. As can be seen, the probability density 215 has shifted significantly upward and is centered around a little more than 6 sigma.

The fourth scenario has a test set with both a deviating mean and an increased standard deviation that is supposed to be due to a defect. FIG. 2F illustrates a plot of the probability density 220 of the alike test for the second scenario. As can be seen, the probability density 220 has shifted significantly upward and is centered around a little more than 8 sigma.

With the above-mentioned threshold of sigma=4, nearly all cases of a defective module would be detected. This illustrates that based upon such modelling, threshold values may be set to achieve a specified probability of detection while limiting the false alarm rate.

Figure 3:
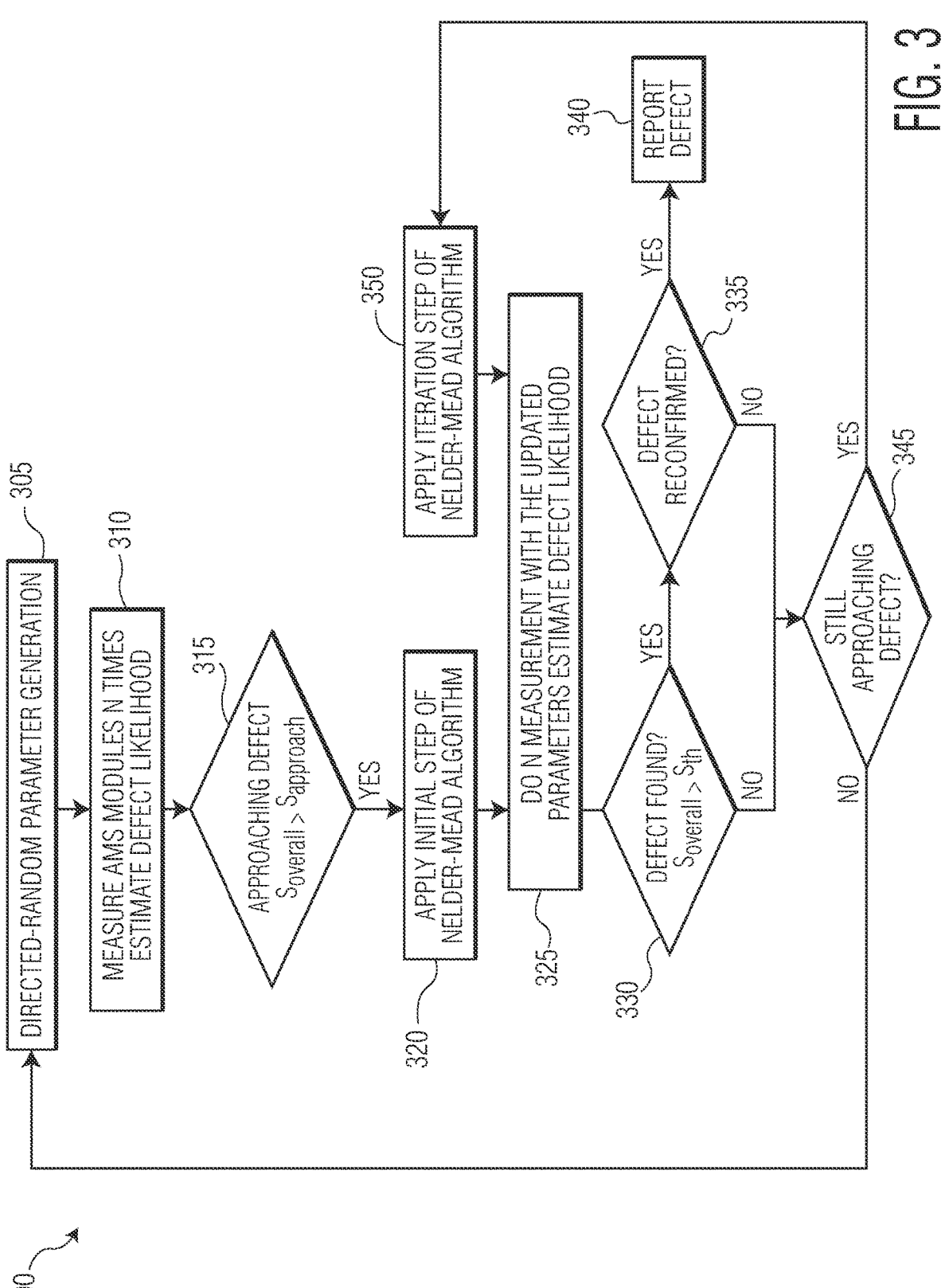
FIG. 3 illustrates a defect detection method carried out by the test system.

FIG. 3 illustrates a defect detection method carried out by the test system. The defect detection method 300 selects of stimuli of the AMS devices 105 using the Nelder-Mead algorithm based upon pairwise module test using the alike test for comparing small number of measurements. The Nelder-Mead approach is an approach for finding the maximum in a large, non-linear multi-dimensional feature space and is often applied to nonlinear optimization problems for which derivatives may not be known. Herein, the maximum means the maximum deviation of the measurements of the reference module vs. the module under test.

The alike test approach allows comparing different modules when only a small number of measurements of the same parameter are present, e.g., only 5 measurements of the gain, under a certain stimulus parameter setting. In case of, e.g., 100 measurements, it would be easy to calculate the statistics both of the reference module(s), and the module under test. In reality, however, 100 measurements would take too long time, given the many points in the feature space. The alike test is applied in a unique way and with a unique ratio and mapping for obtaining the likelihood of the presence of a defect for comparing to a critical level.

The defect detection method 300 begins with the generation of a directed random set of stimulus parameters P 305. Directed random means that some of the parameters are enumerated while others are chosen randomly. This may be specified with engineering input or other information regarding the source and likelihood of detects in the AMS devices 105. For example, if the AMS device under test is known to be susceptible to certain types of defects, for example at high frequencies, then the random parameter generation may give more weight to making high frequency measurements. In other embodiments this selection may be completely random over the parameter space.

Next, the defect detection method 300, for this stimulus parameter set P, executes the BIST operation N times 310 to obtain sufficient measurements for pairwise comparison of the M modules and calculating estimates of the defect likelihood as described above. The calculated defect likelihood estimates $r_{mean}$ and $r_{var}$ may be mapped to $s_{mean}$ and $s_{var}$ as described above to determine an estimate of overall defect likelihood using the alike test, where the estimate is denoted as $S_{overall}$, which is the maximum of the defect probabilities of all module pairs.

Next, the defect detection method 300 determines if stimulus parameters are approaching a potential defect 315. This may be done by having a second threshold $S_{approach}$ that indicates that the current stimulus parameters may be near stimulus parameters that would indicate a defect. The approach threshold $S_{approach}$ is less than a default threshold $S_{th}$ that will be used later to identify a defect. If the defect detection method 300 is not approaching a defect, then the defect detection method 300 returns to step 305 and randomly generates a new set of stimulus parameters P and then continues.

If the defect detection method 300 is approaching a defect, then the defect detection method 300 continues to step 320 executes an initial step of the Nelder-Mead algorithm. The initial step of the Nelder-Mead algorithm will generate updated stimulus parameters in order to find parameters that may indicate a defect. Then the detection method 300 repeats the N measurements using the updated parameters from the Nelder-Mead algorithm and estimates the defect likelihood and calculates $S_{overall}$ again.

Then the defect detection method 300 compares $S_{overall}$ with a threshold value $S_{th}$ 330. If $S_{overall}$ is greater than $S_{th}$, then a defect has been found. When a defect is found, the defect may be reconfirmed 335 by running the test again (i.e., steps 325 and 333). In this defect confirmation 335, the number of measurements may include N tests, but alternatively, during the defect conformation 335 more than N measurements may be taken and used. Then the defect detection method 300 reports a defect 340. This report may include information regarding the specific AMS devices 105 that demonstrates a defect. In an alternative embodiment, the defect confirmation 335 may be omitted.

If a defect is not found at step 330 or the defect is not confirmed at step 335, the defect detection method 300 may again determine if a defect is being approached 345 by comparing $S_{overall}$ the approach threshold $S_{approach}$. If the defect detection method 300 is not approaching a defect, then the defect detection method 300 returns to step 304 and randomly generates a new set of stimulus parameters P and then continues. In another embodiment, a count of the number of iterations through steps 350, 325, 330, and 345 may be kept and compared to a threshold counter value at step 345 in addition to checking against $S_{overall}$. If the number of iterations exceed the threshold counter value then the defect detection method 300 continues to step 305. If the number of iterations does not exceed the threshold counter value the defect detection method continues to step 350. This provides a way to limit the amount of time spent searching for parameters that uncover a defect condition.

If the defect detection method 300 is approaching a defect, then the defect detection method 300 continues to step 350 where an iteration step of the Nelder-Mead algorithm is performed to update the stimulus parameters to continue searching for parameter set that finds a possible defect in the AMS devices 105. This new parameter set is chosen by the search algorithm such that the new parameter set leads to a sharper difference of the output values of the test module versus the reference module. Then the defect detection method 300 continues to step 325.

The test system 100 may be implemented using a combination of hardware and software as follows. A processor may be used to carry out the post processing 112, systematic mismatch removal 114, defect likelihood estimation 116, and defect detection method 300. These processes may be handled by a processor in the system as a background process. Computer software would be run on the processor to carry out these functions. Further, parts of the BIST, e.g., calculation of the response (e.g., FFT, response values like gain, phase shift, distortion etc.) may optionally be calculated by the processor (especially if the processor is on a chip implementing the BIST or AMS.) The BIST device in AMS devices 105 may include: a stimulus module to provide stimulus signals of selectable frequency, amplitude, waveform etc.; a capture module to capture the AMS device response for later calculation of the response; and a control/calculation module to calculate the response.

Figure 4:
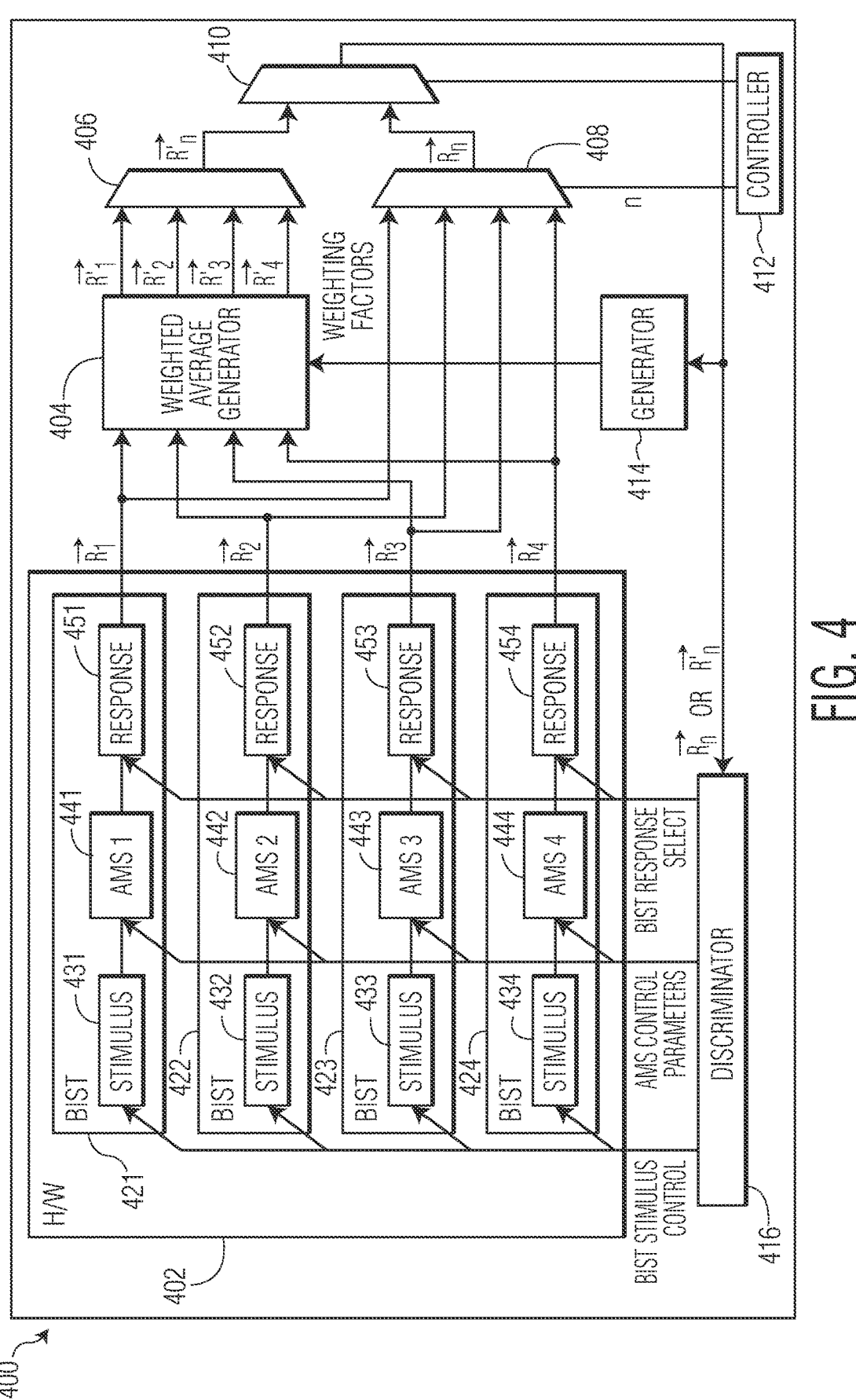
FIG. 4 illustrates a second embodiment of a test system.

FIG. 4 illustrates a second embodiment of a test system. The test system 400 uses a generative adversarial network (GAN) to select the stimulus parameters and the weights used to produce a weighted average of the other AMS devices. In general, tasks similar to the system testing described herein have been successfully addressed with by artificial neural networks. This especially relates to the system test application addressed herein where the relationship between the control parameters and the resulting effect on the behavior of the AMS devices is not known (and they cannot be known, given the many different positions where a defect can occur). Because modelling is not possible, learning the system behavior may be accomplished with a GAN.

A GAN includes two neural networks that contest with each other in the form of a zero-sum game, where one agent's gain is another agent's loss. Given a training set, this technique learns to generate new data with the same statistics as the training set. For example, a GAN trained on photographs can generate new photographs that look at least superficially authentic to human observers, having many realistic characteristics. This may be done using unsupervised learning.

The core idea of a GAN is based on the indirect training through the discriminator, another neural network that can tell how realistic the input seems, which itself is also being updated dynamically. This means that the generator is not trained to minimize the distance to a specific image, but rather to fool the discriminator. This enables the model to learn in an unsupervised manner.

A real-life analogy of a GAN is provided using the following example. Imagine there is a game with three players: a government mint which prints legitimate money; a counterfeiter which produces fake currency hoping to make some quick criminal profits; and a police officer who wants to tell the difference between the real and fake currency.

During each round of the game, the mint and the counterfeiter each present a batch of money (real and fake, respectively) to the police officer. The mint can be considered a constant—it only produces the same type of real money over and over again. However, the counterfeiter is trying to produce fake money that looks as realistic as possible. At the same time, the police officer is doing their best to accurately distinguish fake money from real money.

At the end of each round, the scores of the police officer and the counterfeiter are tallied up. If the counterfeiter succeeded in fooling the police, the counterfeiter gets a good score and the police gets a low score and vice versa if the police correctly mark the counterfeit as fake currency. Based on these results, the counterfeiter adjusts their printing techniques, and the police officer sharpens their sensitivity to the telltale traces of fake currency. The players then start a new round with better counterfeiting and detection skills.

At the end of this learning process, it is of less importance if the police officer can recognize, e.g., 20% or 80% of the fake money—but it does matter that both the counterfeiter and the police officer have drastically improved in their respective tasks. Especially it does matter that this kind of learning was unsupervised learning, i.e., it did not require external expert human effort.

In the second embodiment of the test system, a standard GAN is used, but it is hooked up to the circuit under test in a unique way. Also certain features of the GAN are implemented in a unique way.

FIG. 4 illustrates the relevant parts of the test system 400. The sub-system 402 includes blocks that are realized in hardware, whereas all other blocks may be software modules that are executed by an on-chip processor. In other embodiments the different blocks may be implemented in software or hardware.

The sub-system 402 includes BIST devices 421-424. Each of the BIST devices 421-424 include a stimulus generator (431-434 respectively), AMS device (441-444 respectively), and response analyzer (451-454 respectively). The AMS devices 441-444 are the AMS devices that are under test. The stimulus generators 431-434 generate the test stimulus inputs used to test the AMS devices 441-444. The response analyzers 451-454 process and analyze the outputs of the AMS devices 441-444 to produce a response output.

The BIST devices calculate the response functions of the AMS devices 441-444. A response output includes measurements at different frequencies, bias currents, etc. A response output may hence be the gain measured at different frequencies, a cross talk measured at different frequencies, intermodulation measured at different signal amplitudes, etc. Assuming for example that there are four identical modules, these response outputs for the AMS devices 441-444 are designated as $\vec{R}_1 \ldots \vec{R}_4$. The various elements of the BIST devices 421-424 may be implemented using hardware. Optionally parts of the BIST devices 421-424 may be implemented using software running on a processor.

A discriminator 416 attempts to detect a suspected anomaly in one of four analog modules, i.e., the discriminator 416 attempts to detect if one of the modules behaves differently from the remaining three modules. The input values of the discriminator 416 are module response out for each of the four modules, $\vec{R}_1 \ldots \vec{R}_4$. The output values of the discriminator 416 are stimulus generator stimulus parameters, AMS control parameters, and BIST response select. The discriminator 416 may be part of the GAN.

The generator 414 uses the weighted average generator 404 to create estimated responses $\vec{R}_1' \ldots \vec{R}_4'$ as weighted averages of the other modules as follows:

for AMS device 441, $\vec{R}_1'$ as weighted average of $\vec{R}_2'$, $\vec{R}_3'$, $\vec{R}_4'$, which best matches $\vec{R}_1$;

for AMS device 442, $\vec{R}_2'$ as weighted average of $\vec{R}_1$, $\vec{R}_3'$, $\vec{R}_4'$, which best matches $\vec{R}_2$;

for AMS device 443, $\vec{R}_3'$ as weighted average of $\vec{R}_1$, $\vec{R}_2'$, $\vec{R}_4$, which best matches $\vec{R}_4$; and for AMS device 444, $\vec{R}_4'$ as weighted average of $\vec{R}_1$, $\vec{R}_2$, $\vec{R}_3$, which best matches $\vec{R}_4$.

The weighted average generator 404 may be implemented in hardware, software running on a processor, or a combination thereof.

It is then the task of the discriminator 416 to detect if $\vec{R}_1$ or $\vec{R}_1'$ belong to AMS device 441, to detect if $\vec{R}_2$ or $\vec{R}_2'$ belong to AMS device 442, and so forth. This detection is required to distinguish marginally faulty modules from fault-free modules.

The generator 414 and discriminator 416 are controlled by the controller 412, which selects the AMS device (441-444) under test, and the controller 412 determines if the actual or the estimated response are fed to the discriminator. This choice may be made based upon determining the difference between the actual and the estimated response are greater than a threshold value. The controller 412 may control multiplexer 406 and multiplexer 408 to select the desired outputs of the weighted average generator 404 and sub-system 402, respectively. The controller 412 then controls multiplexer 410 to select whether Rn or Rn is sent to discriminator 416. Multiplexer 406, multiplexer 408, and multiplexer 410 may be implemented either in hardware or software.

The generator 414 and discriminator 416 may be implemented as software running on a processor. As the generator 414 and discriminator 416 are machine learning models they may be implemented on processing hardware specifically designed for implementing machine learning models. Further, the controller 412 may be implemented either in hardware, software running on a processor, or a combination thereof.

These weighted averages may vary (both for a fault-free module, and for a faulty module) under different control parameters, like bias current/reference voltage, amplification settings, etc. Likewise, the difference between faulty and fault-free module usually depends on such control parameters.

Figure 5A:
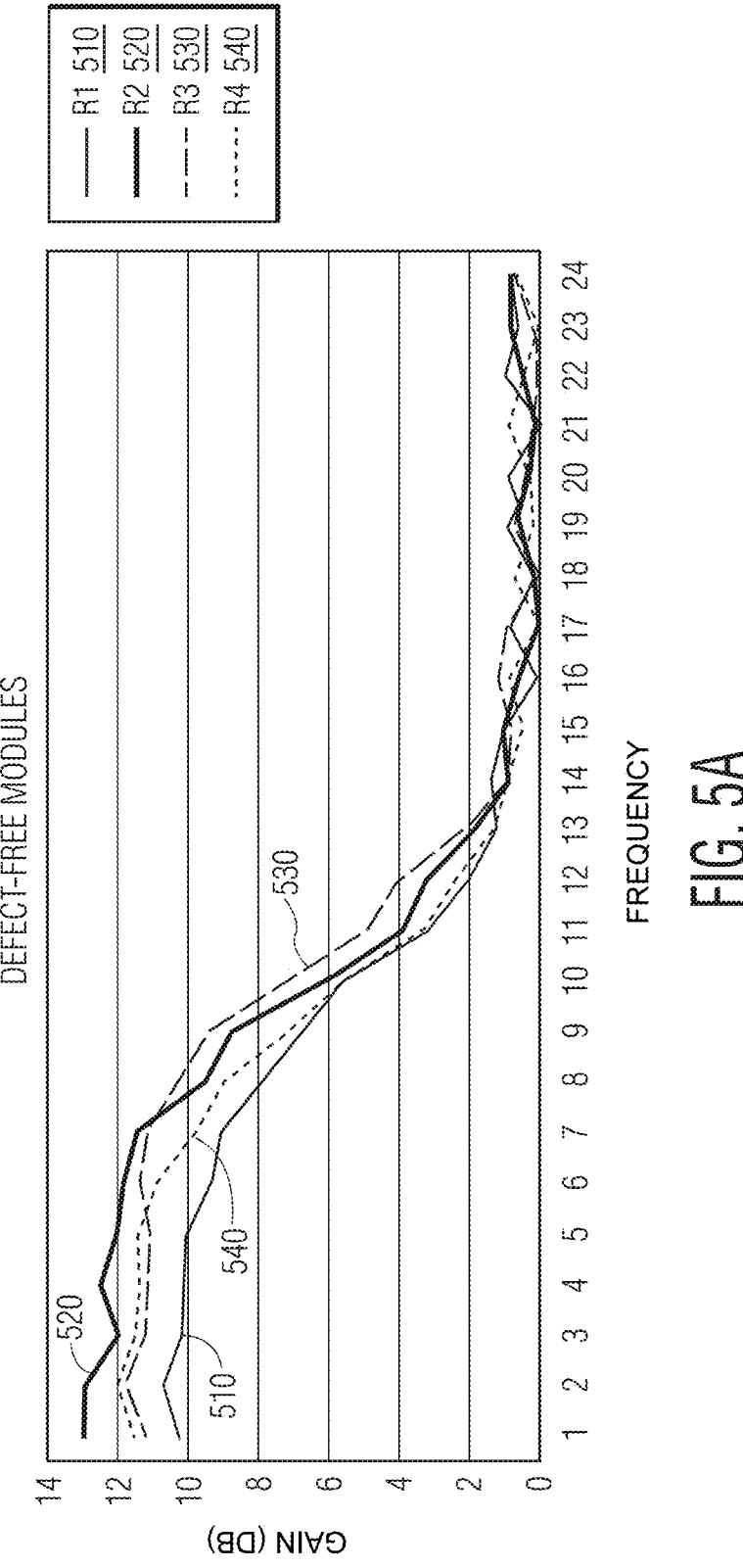
FIGS. 5A-5D illustrate plots of the frequency response for various groups of the responses R.

An example of the operation of the test system 400 using the responses $\vec{R}_1 \ldots \vec{R}_4$ and the respective weighted averages in the case of defective and defect-free modules were simulated. Responses $\vec{R}_1 \ldots \vec{R}_4$ are assumed to be the frequency response of a low-pass filter. FIGS. 5A-5D illustrate plots of the frequency response for various groups of the $\vec{R}_1 \ldots \vec{R}_4$. In FIGS. 5A-FD there are 24 values at the frequency (x) axis, hence the responses $\vec{R}_1 \ldots \vec{R}_4$ are vectors with 24 elements each. FIG. 5A illustrates the plots of the various responses when there is no defect. It can be seen in FIG. 5A that even for defect-free modules, $\vec{R}_1 \ldots \vec{R}_4$ are slightly different from each other due to manufacturing variations.

Figure 5B:
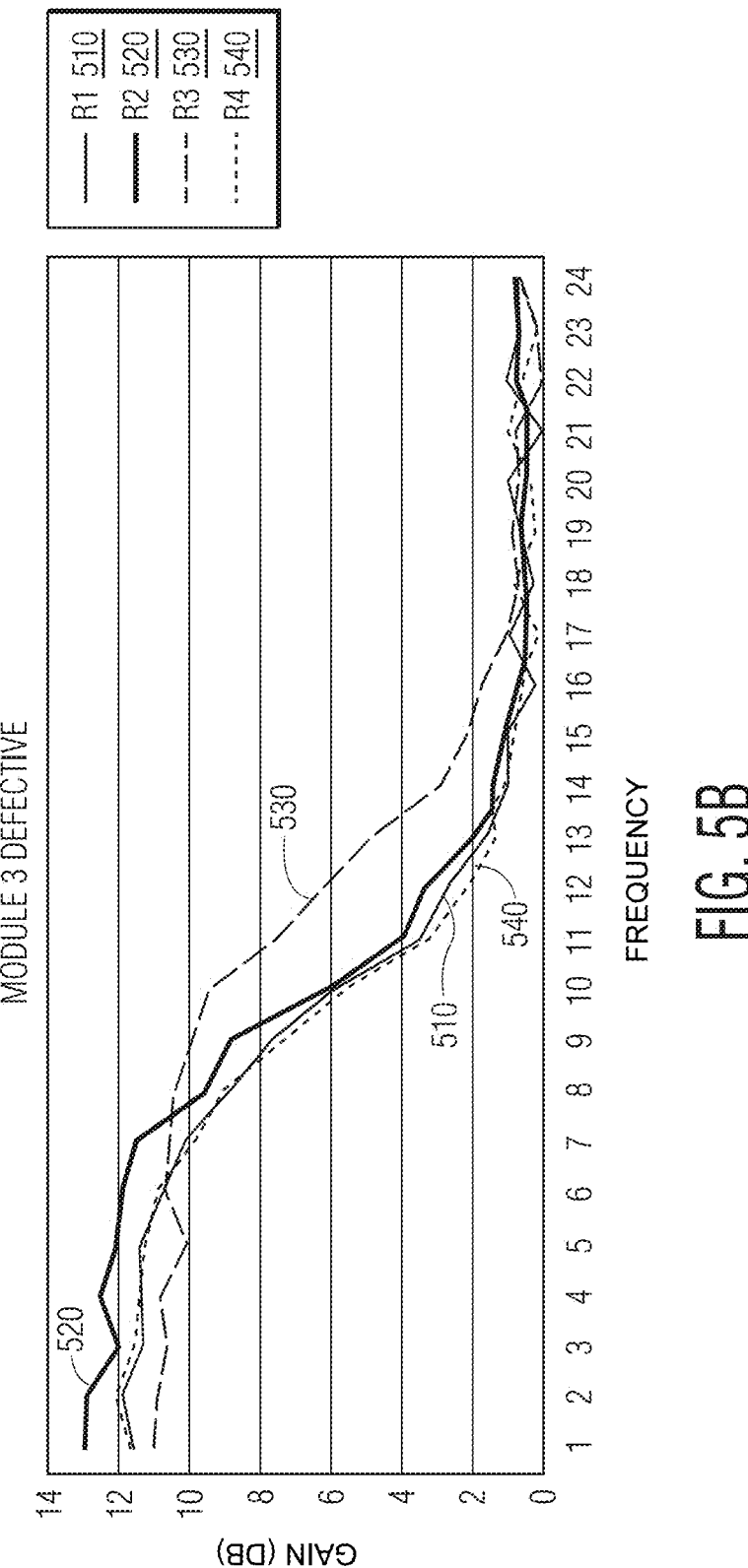

In FIG. 5B, module 3 is assumed to be slightly defective. The plot of $\vec{R}_3$ still shows a low-pass behavior, but with a slightly higher cut-off frequency. Such a slight difference to the normal behavior is hard to detect, especially if the test is performed at the wrong place of the feature space, i.e. with a wrong signal frequency or amplitude, wrong base settings, etc.

Figure 5C:
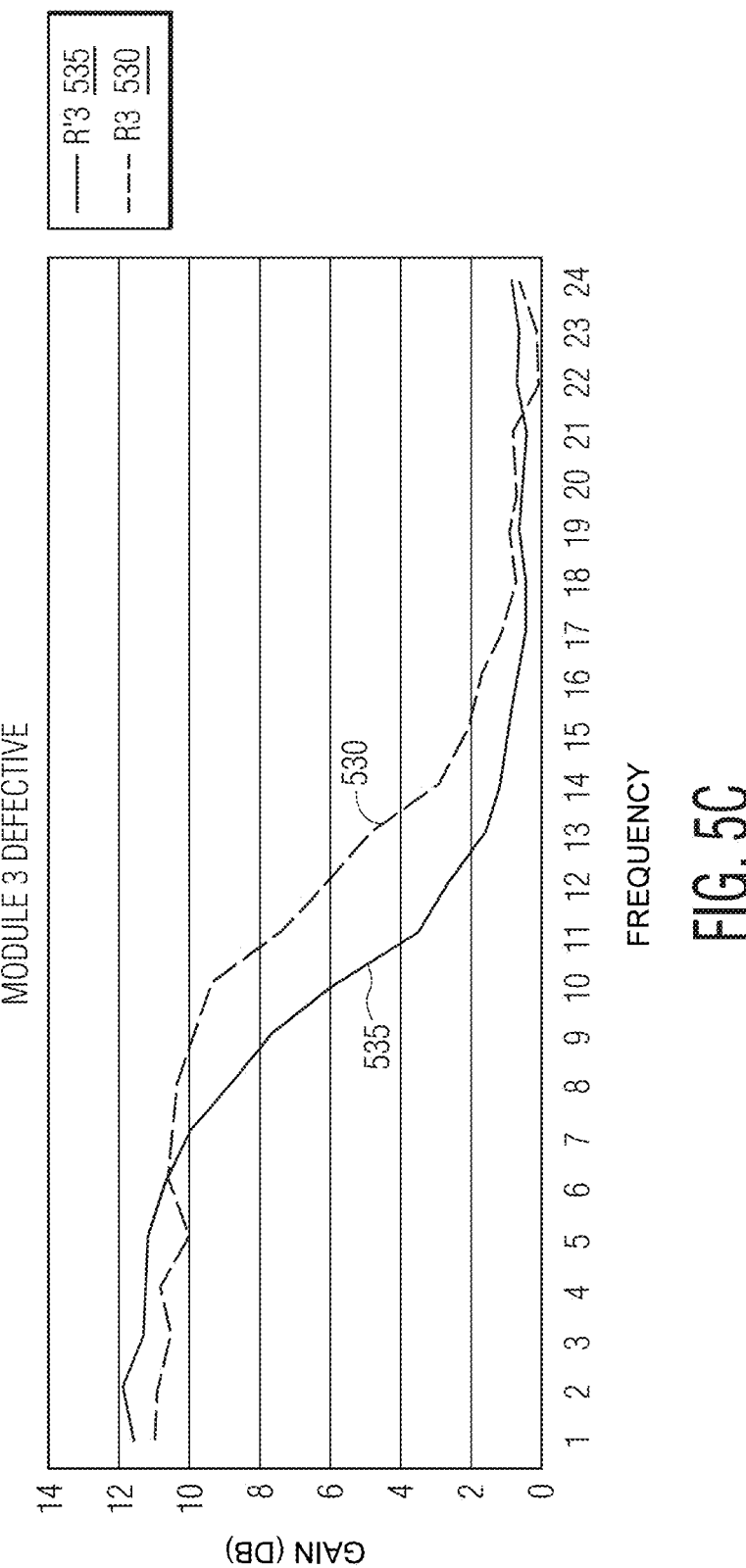

As can be seen in FIG. 5C, the weighted average $\vec{R}_3'$ (i.e., the average of the modules 1, 2, and 4, which is here used as an estimate for $\vec{R}_3$ in a defect-free module) is substantially different from the actual $\vec{R}_3$ of module 3, so that module 3 may be recognized as defective.

Figure 5D:
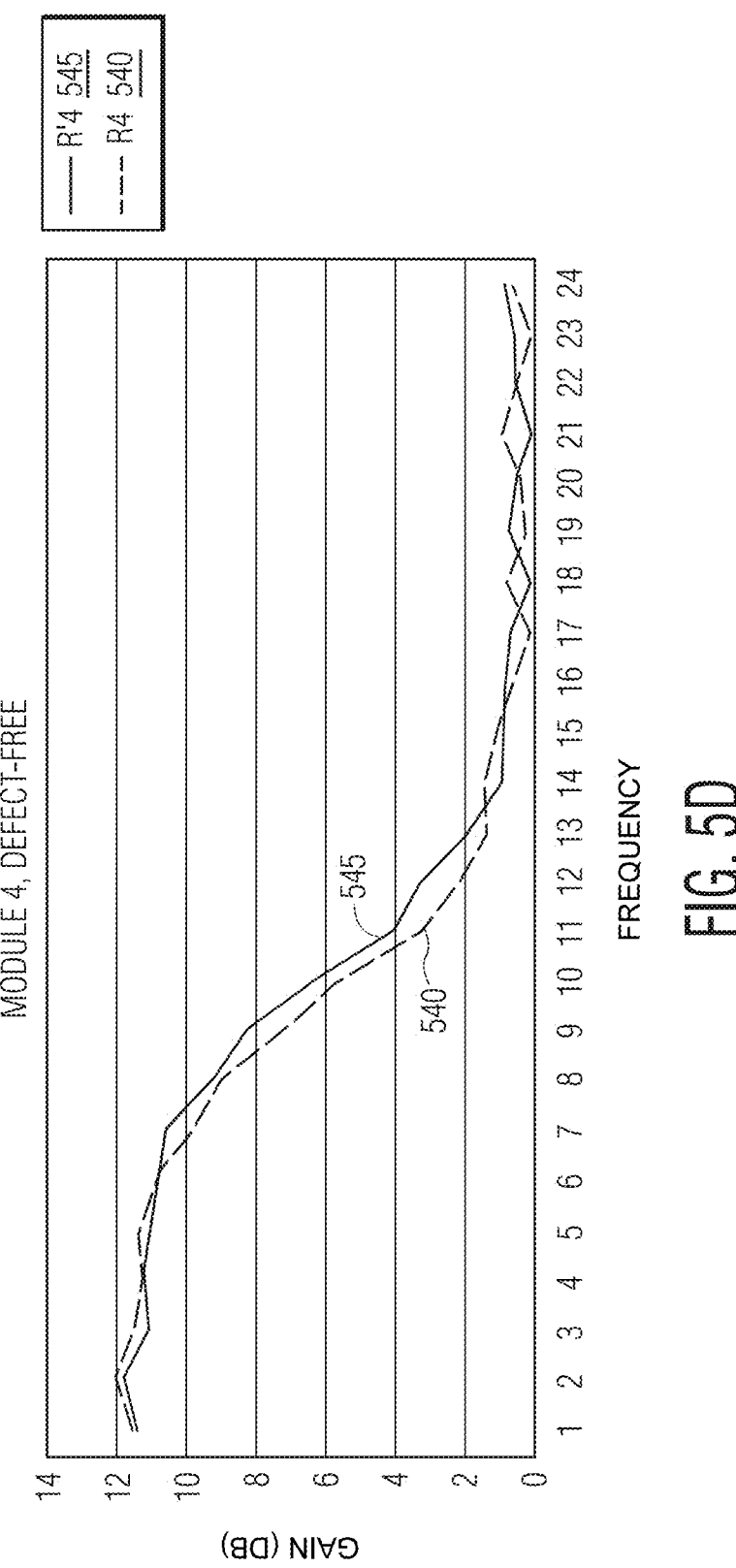

Finally, for comparison, FIG. 5D illustrates the weighted average $\vec{R}_4'$ (i.e., the weighted average of modules 1, 2, and 3), as well as the actual response $\vec{R}_4$. In this case of a defect-free module 4, $\vec{R}_4'$ is very similar to $\vec{R}_4$, so that module 4 can be recognized as defect-free.

The GAN will continue to iteratively search for points in the feature space where the difference between $\vec{R}_i'$ and $\vec{R}_i'$ is larger—in case the difference would exceed a certain limit, the module i would be flagged as having a slight defect. This would cause the functional safety mechanism to flag the respective unit as less reliable and remind the driver to get the unit repaired soon.

The test systems described herein may operate periodically. Over time the test system searches the parameter space so that defects can be detected.

The test systems herein have been described using the example of an auto based radar system. The test systems herein may also be used for any device of which multiple identical instances are used. The test systems may be used when there are at least two identical devices. Some examples of other systems utilizing the test system may include: RF interface ICs, e.g. WLAN/mobile phone interfaces which use MIMO, and hence multiple identical transmitter/receiver modules; sensor ICs using multiple AMS devices, e.g. in an automotive context; sensor arrays, either in a triple redundancy environment, or for measuring environment parameters at different locations.

It should be appreciated by those skilled in the art that any block diagrams herein represent conceptual views of illustrative circuitry embodying the principles of the invention.

Although the various exemplary embodiments have been described in detail with particular reference to certain exemplary aspects thereof, it should be understood that the invention is capable of other embodiments and its details are capable of modifications in various obvious respects. As is readily apparent to those skilled in the art, variations and modifications can be affected while remaining within the spirit and scope of the invention. Accordingly, the foregoing disclosure, description, and figures are for illustrative purposes only and do not in any way limit the invention, which is defined only by the claims.

What is claimed is:

1. A method of testing a plurality of devices of a same type wherein each of the plurality of devices of the same type include a built-in self-test (BIST) device, comprising:

randomly generating, by a processor of the BIST device, a stimulus signal based on a stimulus parameter;

applying, by the BIST device, the stimulus signal N times to the plurality of devices of the same type;

measuring, by the processor, a response of the plurality of devices of the same type to the stimulus signal to produce M×N response outputs, wherein M is a number of the plurality of devices of the same type;

calculating, by the processor, a defect likelihood for a test set of the plurality of devices of the same type based upon a mean of a reference set of the plurality of devices of the same type response outputs, a mean of a test set response outputs, a standard deviation of reference set response outputs, and a standard deviation of a test set response outputs;

determining, by the processor, that the defect likelihood for the test set is greater than a first threshold;

applying, by the processor, an initial operation of a directed random search algorithm to obtain an updated stimulus parameter in response to determining that the defect likelihood is greater than the first threshold, wherein the updated stimulus parameter is used to generate updated stimulus signal to be applied to the plurality of devices of the same type to improve detection of a defect;

applying, by the BIST devices, the updated stimulus signal N times to the plurality of devices of the same type;

measuring, by the processor, a response of the plurality of devices of the same type to the updated stimulus signal to produce M×N updated response outputs;

calculating, by the processor, a defect likelihood for the test set based upon a mean of a reference set updated response outputs, a mean of a test set updated response outputs, a standard deviation of a reference set updated response outputs, and a standard deviation of a test set updated response outputs; and determining, by the processor, that the defect likelihood for the test set is greater than a second threshold, wherein the second threshold is greater than the first threshold.

2. The method of claim 1, further comprising indicating a defect in response to determining that the defect likelihood is greater than the second threshold.

3. The method of claim 1, further comprising:

in response to determining that the defect likelihood is greater than the second threshold repeating:

applying the updated stimulus signal N times to the plurality of devices of the same type;

measuring the response of the plurality of devices of the same type to the updated stimulus signal to produce M×N second response outputs;

calculating the defect likelihood for a test set based upon a mean of the reference set updated response outputs, a mean of the test set updated response outputs, a standard deviation of reference set updated response outputs, and a standard deviation of the test set updated response outputs;

determining that the defect likelihood for the test set is greater than the second threshold; and indicating a defect in response to determining that a repeated defect likelihood is greater than the second threshold.

4. The method of claim 1, wherein the directed random search algorithm is a Nelder-Mead search algorithm.

5. The method of claim 1, wherein calculating the defect likelihood for the test set further includes:

calculating a first moment statistical test $r_{mean}$ as $$r_{mean} = \frac{\text{mean}(\text{test}_{set}) - \text{mean}(\text{ref}_{set})}{std(\text{ref}_{set})},$$

wherein std is a sample standard deviation; and calculating a second moment statistical test $r_{var}$ as $$r_{var} = \frac{std(\text{test}_{set})}{std(\text{ref}_{set})}$$

wherein an estimated defect likelihood s is determined from a mean value of a standard normal distribution as: s=max(abs($r2s_{m(r_{mean})}$), abs($r2s_{v(r_{var})}$), wherein r2s_m( ) and r2s_v( ) are functions that map the values $r_{mean}$ and $r_{var}$ to values $s_{mean}$ and $s_{var}$ with $cdf_{m(r_{mean})}$=normcdf ($s_{mean}$), $cdf_{v(r_{var})}$=normcdf($s_{var}$), and cdf$_m$( ) and cdf$_v$( ) are cumulative distribution functions of ratios $r_{mean}$ and $r_{var}$ respectively, and normcdf(s) is a cumulative distribution function of the standard normal distribution.

6. The method of claim 1, further comprising:

in response to determining that an updated estimated defect likelihood is less than the first threshold repeating:

randomly generating stimulus signal based on the stimulus parameter;

applying the stimulus signal N times to the plurality of devices of the same type; and measuring the response of the plurality of devices of the same type to the stimulus signal to produce M×N response outputs; and in response to determining that the updated estimated defect likelihood is greater than the first threshold:

applying an iteration operation of the directed random search algorithm to update the stimulus parameter.

7. A test system for testing a plurality of devices of a same type, comprising:

a plurality of built-in self-test (BIST) devices, wherein each of the plurality of devices of the same type include one of the plurality of BIST devices;

at least one processor; and at least one memory storing instructions, that in response to determining that executed by the at least one processor, cause the test system at least to:

randomly generate a stimulus signal based on a stimulus parameter;

apply, by the one of the plurality of BIST devices, the stimulus signal N times to the plurality of devices of the same type;

measure, by the plurality of devices of the same type, a response of the plurality of devices of the same type to the stimulus signal to produce M×N response outputs, wherein M is a number of the plurality of devices of the same type;

calculating a defect likelihood for a test set of the plurality of devices of the same type based upon a mean of a reference set of the plurality of devices of the same type response outputs, a mean of a test set response outputs, a standard deviation of reference set response outputs, and a standard deviation of a test set response outputs;

determine that the defect likelihood for the test set is greater than a first threshold;

apply an initial operation of a directed random search algorithm to obtain an updated stimulus parameter in response to determining that the defect likelihood is greater than the first threshold, wherein the updated stimulus parameter is used to generate updated stimulus signal applied to the plurality of devices of the same type to improve detection of a defect;

apply, by the BIST devices, the updated stimulus signal N times to the plurality of devices of the same type;

measure, by the plurality of devices of the same type, a response of the plurality of devices of the same type to the updated stimulus signal to produce M×N updated response outputs;

calculating a defect likelihood for the test set based upon a mean of a reference set updated response outputs, a mean of a test set updated response outputs, a standard deviation of a reference set updated response outputs, and a standard deviation of a test set updated response outputs; and determining that the defect likelihood for the test set is greater than a second threshold, wherein the second threshold is greater than the first threshold.

8. The test system of claim 7, wherein the at least one memory storing instructions cause the test system at least to indicate a defect in response to determining that the defect likelihood is greater than the second threshold.

9. The test system of claim 7, wherein the at least one memory storing instructions cause the test system at least to:

in response to determining that the defect likelihood is greater than the second threshold repeating:

apply the updated stimulus signal N times to the plurality of devices of the same type;

measure the response of the plurality of devices of the same type to the updated stimulus signal to produce M×N second response outputs;

calculate the defect likelihood for the test set based upon a mean of the reference set updated response outputs, a mean of the test set updated response outputs, a standard deviation of reference set updated response outputs, and a standard deviation of the test set updated response outputs;

compare the defect likelihood for the test set to the second threshold; and indicate a defect in response to determining that a repeated defect likelihood is greater than the second threshold.

10. The test system of claim 7, wherein the directed random search algorithm is a Nelder-Mead search algorithm.

11. The test system of claim 7, wherein calculating the defect likelihood for the test set further includes:

calculating a first moment statistical test $r_{mean}$ as $$r_{mean} = \frac{\text{mean}(\text{test}_{set}) - \text{mean}(\text{ref}_{set})}{\text{std}(\text{ref}_{set})},$$

wherein std is a sample standard deviation; and
calculating a second moment statistical test $r_{var}$ as $$r_{var} = \frac{\text{std}(\text{test}_{set})}{\text{std}(\text{ref}_{set})}$$

wherein an estimated defect likelihood s is determined from a mean value of a standard normal distribution as: s=max(abs($r2s_{m(r_{mean})}$), abs($r2s_{v(r_{var})}$), wherein r2s_m( ) and r2s_v( ) are functions that map the values $r_{mean}$ and $r_{var}$ to values $s_{mean}$ and $s_{var}$ with cd $f_{m(r_{mean})}$=normcdf ($s_{mean}$), cdf$_{v(r_{var})}$=normcdf($s_{var}$), and cdf$_v$( ) and cdf$_v$( ) are cumulative distribution functions of ratios $r_{mean}$ and $r_{var}$ respectively, and normcdf(s) is a cumulative distribution function of the standard normal distribution.

12. The test system of claim 7, wherein the at least one memory storing instructions cause the test system at least to:

in response to determining that an updated estimated defect likelihood is less than the first threshold repeat:

randomly generate stimulus signal based on the stimulus parameter;

apply the stimulus signal N times to the plurality of devices of the same type; and measure the response of the plurality of devices of the same type to the stimulus signal to produce M×N response outputs; and in response to determining that the updated estimated defect likelihood is greater than the first threshold:

apply an iterations operation of the directed random search algorithm to update the stimulus parameter.

13. A method of testing a plurality of devices of a same type wherein each of the plurality of devices of the same type include a built-in self-test device, comprising:

generating, by a discriminator, a stimulus signal based on a stimulus parameter, wherein the discriminator is a machine learning model;

applying, by the built-in self-test device, the stimulus signal to the plurality of devices of the same type;

measuring a response of the plurality of devices of the same type to the stimulus signal to produce M response outputs, wherein M is a number of the plurality of devices of the same type;

generating, by a generator, M−1 weights, wherein the generator is a machine learning model;

calculating a first response output from a first identical device of the plurality of devices of the same type as a weighted average of the other M−1 response outputs using the M−1 weights associated with M−1 other devices of the same type;

determining a difference between an estimated first response output and the first response output;

updating the discriminator and the generator using the first response output in response to determining that the difference is less than a threshold;

updating the discriminator and the generator using the estimated first response output in response to determining that the difference is greater than the threshold; and controlling, by a controller the discriminator and the generator to act as a generative adversarial network wherein the discriminator searches for stimulus parameter that indicate defects and wherein the generator to generate M−1 weights that indicate defects.

14. The method of claim 13, further comprising indicating a defect in the first identical device associated with the first response output in response to determining that the difference is greater than the threshold.

15. The method of claim 13, further comprising outputting, by the discriminator, device control parameters to the plurality of devices of the same type.

16. A test system for testing a plurality of devices of a same type wherein each of the plurality of devices of the same type include a built-in self-test device, comprising:

a plurality of built-in self-test (BIST) devices, wherein each of the plurality of devices of the same type include one of the plurality of BIST devices; and at least one processor; and at least one memory storing instructions, that in response to determining that executed by the at least one processor, cause the test system at least to:

generate stimulus parameters by a discriminator implemented as a machine learning model in the at least one processor;

apply the stimulus parameters to the plurality of BIST devices;

receive M response outputs from the plurality of BIST devices, wherein M is a number of the plurality of devices of the same type;

generate M−1 weights by a generator implemented as a machine learning model in the at least one processor;

estimate a first response output from a first identical device of the plurality of devices of the same type as a weighted average of the other M−1 response outputs using the M−1 weights associated with M−1 other devices of the same type;

determine a difference between an estimated first response output and the first response output;

update the discriminator and the generator using the first response output in response to determining that the difference is less than a threshold;

update the discriminator and the generator using the estimated first response output in response to determining that the difference is greater than the threshold; and control the discriminator and the generator to act as a generative adversarial network wherein the discriminator searches for stimulus parameters that indicate defects and wherein the generator to generate M−1 weights that indicate defects.

17. The test system of claim 16, wherein the at least one memory storing instructions cause the test system at least to indicate a defect in the first identical device associated with the first response output in response to determining that the difference is greater than the threshold.

18. The test system of claim 16, wherein the at least one memory storing instructions cause the test system at least to output device control parameters generated by the discriminator to the plurality of devices of the same type.

* * * * *